United States Patent
Huang et al.

(10) Patent No.: US 7,190,066 B2
(45) Date of Patent: Mar. 13, 2007

(54) HEAT SPREADER AND PACKAGE STRUCTURE UTILIZING THE SAME

(75) Inventors: Chender Huang, Kaohsiung (TW); Pei-Haw Tsao, Taichung (TW); Allan Lin, Hsin Chu (TW); Jeffrey Hsu, Hsin Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 3 days.

(21) Appl. No.: 11/073,676

(22) Filed: Mar. 8, 2005

(65) Prior Publication Data

US 2006/0202326 A1    Sep. 14, 2006

(51) Int. Cl.
*H01L 23/12*    (2006.01)
(52) U.S. Cl. ............... 257/704; 257/706; 257/712; 257/713; 257/787; 257/796
(58) Field of Classification Search ........... 257/704, 257/706, 712, 713, 787, 796
See application file for complete search history.

(56) References Cited

U.S. PATENT DOCUMENTS

| 6,191,360 | B1 * | 2/2001 | Tao et al. | 174/522 |
| 2005/0139997 | A1 * | 6/2005 | Chou | 257/712 |

* cited by examiner

*Primary Examiner*—Thien F. Tran
(74) *Attorney, Agent, or Firm*—Birch, Stewart, Kolasch & Birch, LLP

(57) ABSTRACT

A heat spreader and package structure utilizing the same. The heat spreader is embedded in an encapsulant of a package and above a chip therein, wherein the package has a substrate, having a molding gate, and the chip has a center and a corner which is the farthest from the molding gate. The spreader includes a base with a hollow portion therethrough, a plurality of support leads, protruding from the base, on the inner edge, and a cap plate, having a hole at least directly above a region between the center and the corner of the chip, fixed by the support leads to be above the hollow portion, the cap plate.

15 Claims, 6 Drawing Sheets

HEAT SPREADER AND PACKAGE STRUCTURE UTILIZING THE SAME

BACKGROUND

The invention relates to a package structure, and more specifically to a package structure with improved reliability.

As semiconductor device circuit density increases and device feature size decreases, increased numbers of patterned metal levels are required with decreased spacing between metal lines at each level to effectively interconnect discrete devices on semiconductor chips. Layers of insulating materials or films, typically referred as inter-layer dielectric (ILD) layers, separate different levels of metal interconnections. A common insulating material used for ILD layers is silicon oxide having a dielectric constant (k) of about 4.0 to 4.5 relative to vacuum having a k value of 1.0. Unfortunately, as the spacing between the metal lines decreases, the intra-level and inter-level capacitances therebetween increases, as capacitance is inversely proportional to the spacing therebetween. It is therefore desirable to minimize the dielectric constant k of the insulating material between the metal lines to reduce the RC time constant, and thus, the performance of the circuit, e.g., the frequency response or the like, is improved since the signal propagation time in the circuit is adversely affected by the RC delay time.

When an insulating material having a dielectric constant k less than 3, often referred to as a low k material, is utilized as ILD layers between the metal lines, the adhesion between the low k material and metal line, however, is weaker than that between silicon oxide and metal line. Further, the linear thermal expansion coefficient of a conventional encapsulant for a package is typically larger than 10 ppm/° C., and that of silicon, one of the popular semiconductor materials, is approximately 3 ppm/° C. Thus, high thermal expansion coefficient mismatch therebetween results in exertion of thermal stress between a chip and encapsulant in the package. When a low k material is used for ILD layers in the chip, the ILD layers suffer more potential of delamination resulting from the exertion of thermal stress during assembly.

SUMMARY

Thus, embodiments of the invention provide a heat spreader and package structure utilizing the same, releasing and reducing thermal stress induced by environmental factors or package reliability tests on a chip in the package, thereby preventing delamination of ILD layers utilizing a low k material on the chip to improve package reliability.

Embodiments of the invention provide a heat spreader embedded in an encapsulant of a package, above a chip therein, the package having a substrate, having a molding gate, the chip having a center and a corner which is the farthest from the molding gate. The heat spreader includes a base, a plurality of support leads, and a cap plate. The base has a hollow portion therethrough, surrounded by an inner edge. The support leads, with a predetermined width, protrude from the base. Further, the supporting leads are disposed on the inner edge. The cap plate is fixed by the support leads to be above the hollow portion. The cap plate has a hole above and at least as large as a region between the center and the corner of the chip when the heat spreader is embedded in the package.

Embodiments of the invention further provide a package structure utilizing the heat spreader. The structure includes a substrate, a chip, the heat spreader, and an encapsulant. The substrate has a first surface having a first electrode and molding gate thereon, and a second surface, having a second electrode thereon, opposite to the first surface. The chip is disposed on the first surface and beyond the molding gate. The chip has a center, a corner which is the farthest from the molding gate, and a third electrode electrically connecting to the first electrode. The heat spreader is disposed on the first surface and beyond the molding gate. The cap plate of the heat spreader is above the chip and the hole therewith exposes a region between the center and the corner of the chip. The encapsulant fills the area beneath the cap plate and overlying the base of the heat spreader, but exposing the cap plate.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention can be more fully understood by reading the subsequent detailed description in conjunction with the examples and references made to the accompanying drawings, which are given by way of illustration only, and thus are not limitative of the invention, and wherein.

DESCRIPTION

The following embodiments are intended to illustrate the invention more fully without limiting the scope of the claims, since numerous modifications and variations will be apparent to those skilled in this art.

The inventors discover that plastic ball grid array (PBGA) packages with a heat spreader embedded therein, typically referred as heat spreader BGA (HSBGA) packages, suffer from a serious reliability problem. HSBGA packages, comprising a chip with ILD layers utilizing a low k material, typically fail thermal cycle tests (TCT), a JDEC standardized reliability test. The thermal stress induced by TCT, typically causes delamination of the ILD layers near the farthest corner from a molding gate on a substrate of the HSBGA package. When the HSBGA packages fail the TCT tests and must be scraped or downgraded, throughput and yield suffers.

Figure 1A:
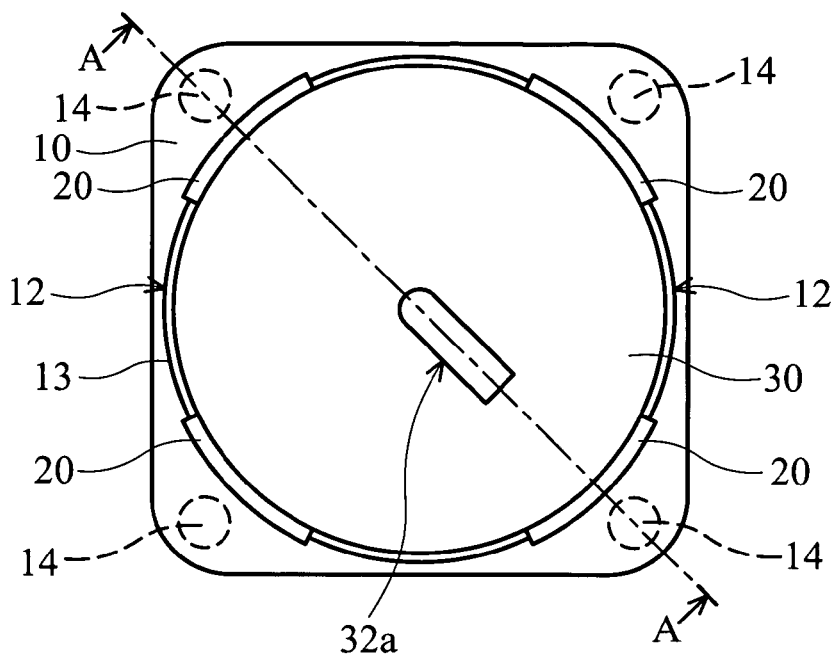
FIG. 1A is a top view of a heat spreader of a first embodiment of the invention.
Figure 1B:
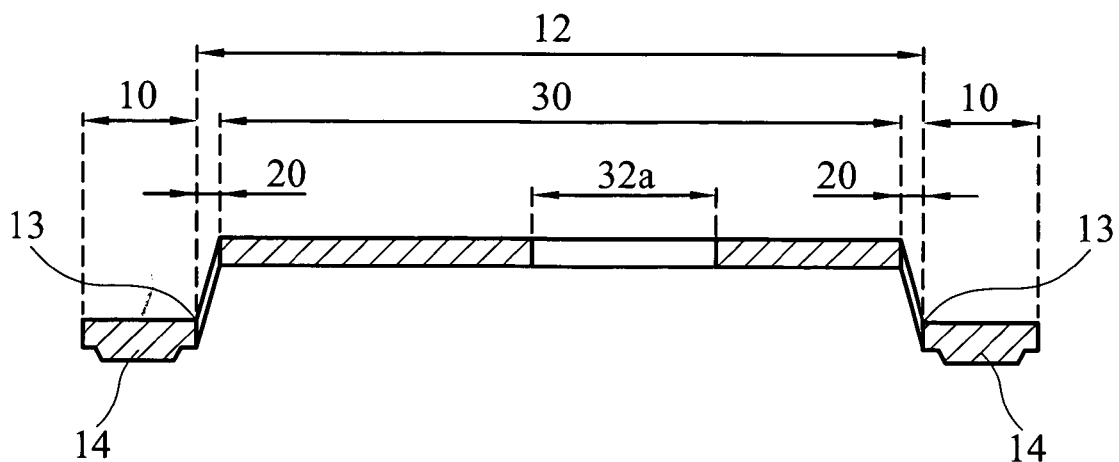
FIG. 1B is a cross-section of the heat spreader shown in FIG. 1A along a line AA.

FIG. 1A is a top view of a heat spreader of a first embodiment of the invention. FIG. 1B is a cross-sectional view along a line AA of the heat spreader. The heat spreader comprises a base 10, a plurality of support leads 20, and a cap plate 30, which preferably comprise same material, such as, copper, aluminum, alloys thereof, or other thermally conductive materials. The base 10 comprises a penetrating opening 12 surrounded by an inner edge 13. Further, the base 10 preferably comprises contact pads 14 for alignment and attachment to a substrate. The opening 12 is preferably approximately circular. Support leads 20 with a predetermined width are disposed on the inner edge 13 and protrude from the base 10. The support leads 20 are preferably arranged at a predetermined pitch. The quantity, width, and pitch of the support leads 20 depend on their function and must provide sufficient support of the cap plate 30. The cap plate 30 is fixed by the support leads 20 to be above the hollow portion 12. According to an important feature of the invention, the cap plate 30 comprises a hole 32a may be formed by punching, etching or other method or apparatus known by those skilled in the art. The hole 32a can be any desired shape, but is preferably a slot to reduce area loss of the cap plate 30 which transfers heat from a package utilizing the heat spreader. The hole 32a may extend to an edge of the cap plate 30 and further divide the cap plate 30 into several pieces as desired under the condition that at least one or each support lead 20 must at least partially hold the cap plate 30 to maintain stability of the cap plate 30 during an encapsulation step of a package process to prevent shorts in an electrical connection of the package.

Figure 1C:
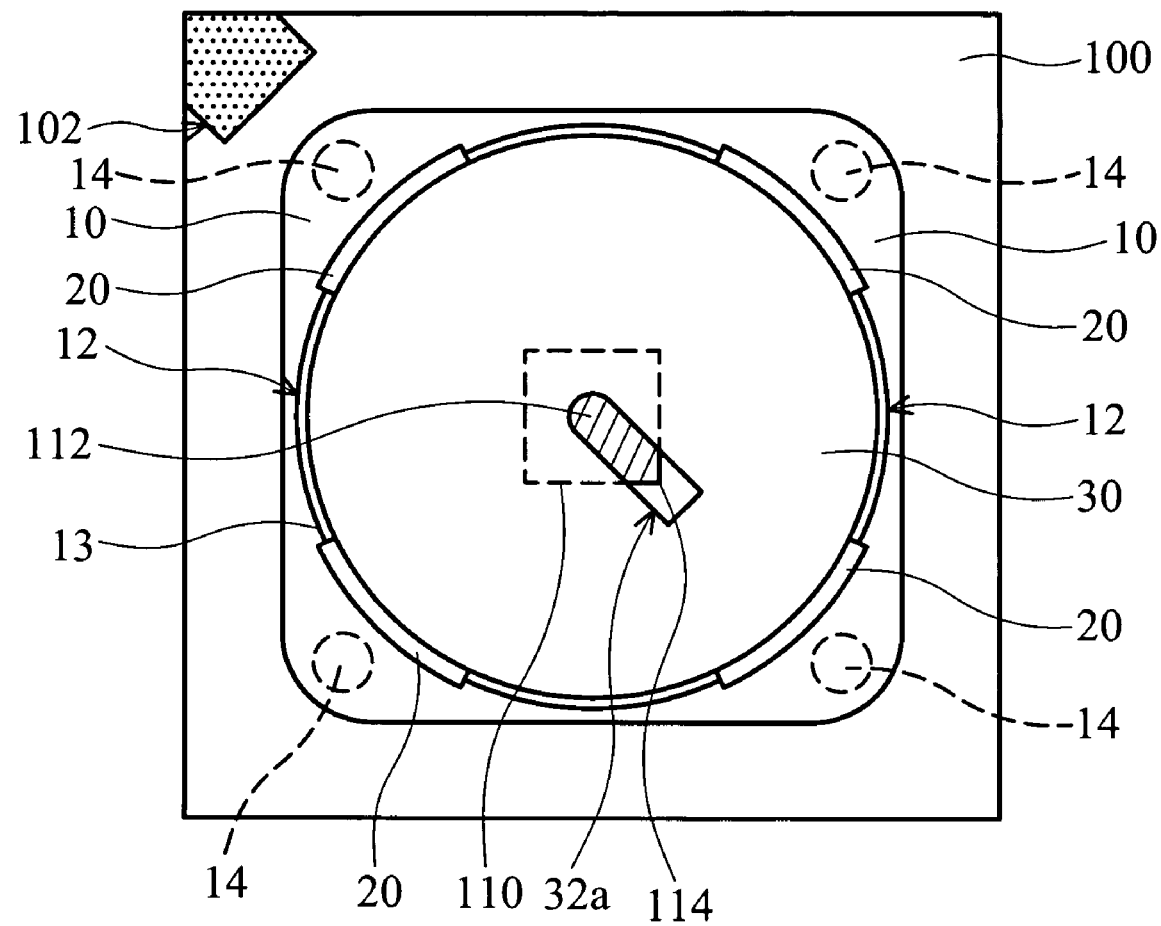
FIG. 1C is a top view of the relationship of a chip, substrate, and heat spreader shown in FIG. 1A when the heat spreader is disposed on the substrate with the chip thereon during a packaging process.

In FIG. 1C, the heat spreader is aligned and attached to a substrate 100, with a chip 110 disposed thereon and a molding gate 102 at a corner, using the contact pads 14. The hole 32a is directly above and exposes a region between a center 112 and corner 114 of the chip 110, wherein the corner 114 is the farthest from the molding gate 102. Thus, the position and size of the hole 32a depends on the predetermined region of the chip 110. The hole 32a, directly above a region between the center 112 and corner 114, assists in release of thermal stress induced by thermal cycles from the environment or performance in reliability tests such as a TCT on a package structure utilizing the heat spreader of this embodiment. Thus, even when the chip 110 comprises the same low k material as the ILD layers thereof, resulting in weaker adhesion between the metal lines and ILD layers thereof, the stress relief induced by the hole 32a prevents delamination of ILD layers at the corner 114, the farthest from the molding gate 102.

Figure 2A:
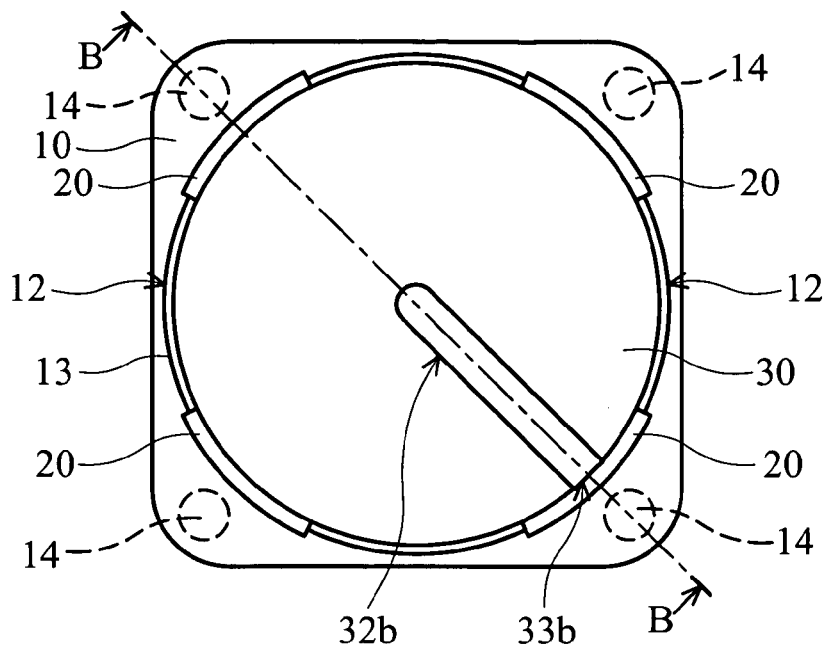
FIG. 2A is a top view of a heat spreader of a second embodiment of the invention.
Figure 2B:
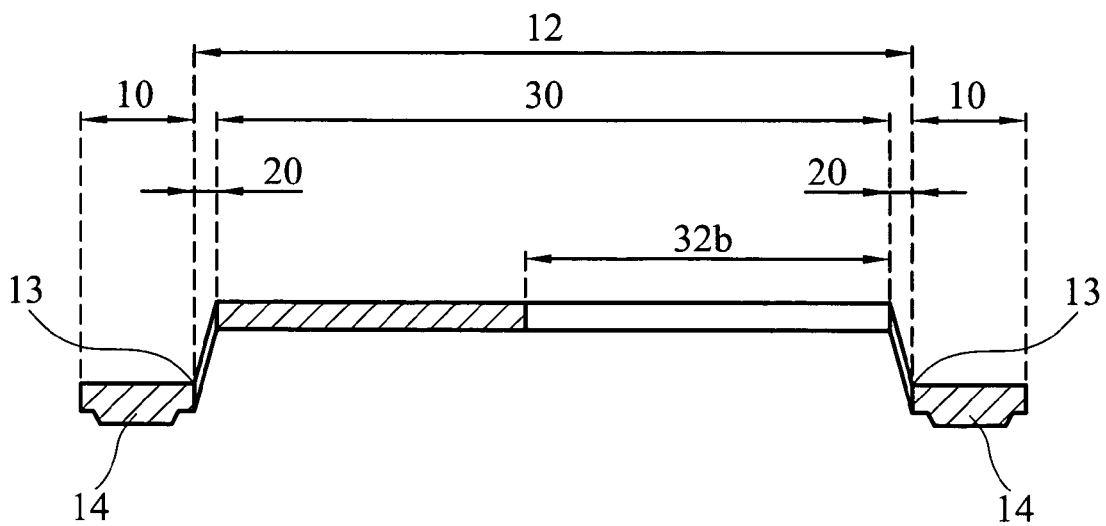
FIG. 2B is a cross-section of the heat spreader shown in FIG. 2A along a line BB.

In FIG. 2A, a top view of a heat spreader of a second embodiment of the invention is shown. A cross-section along a line BB of the heat spreader is shown in FIG. 2B. The heat spreader is similar to that of the first embodiment, but the hole 32b extends to an edge of the cap plate 30, forming an extending end 33b. Thus, details regarding other elements are the same as those in the first embodiment, and thus, are omitted herefrom. The position and size of the extending end 33b must be controlled so that at least one, or both support leads 20 can at least partially hold the cap plate 30 to stablize the cap plate 30 in an encapsulation step of a package process to prevent shorts to an electrical connection of the package.

Figure 2C:
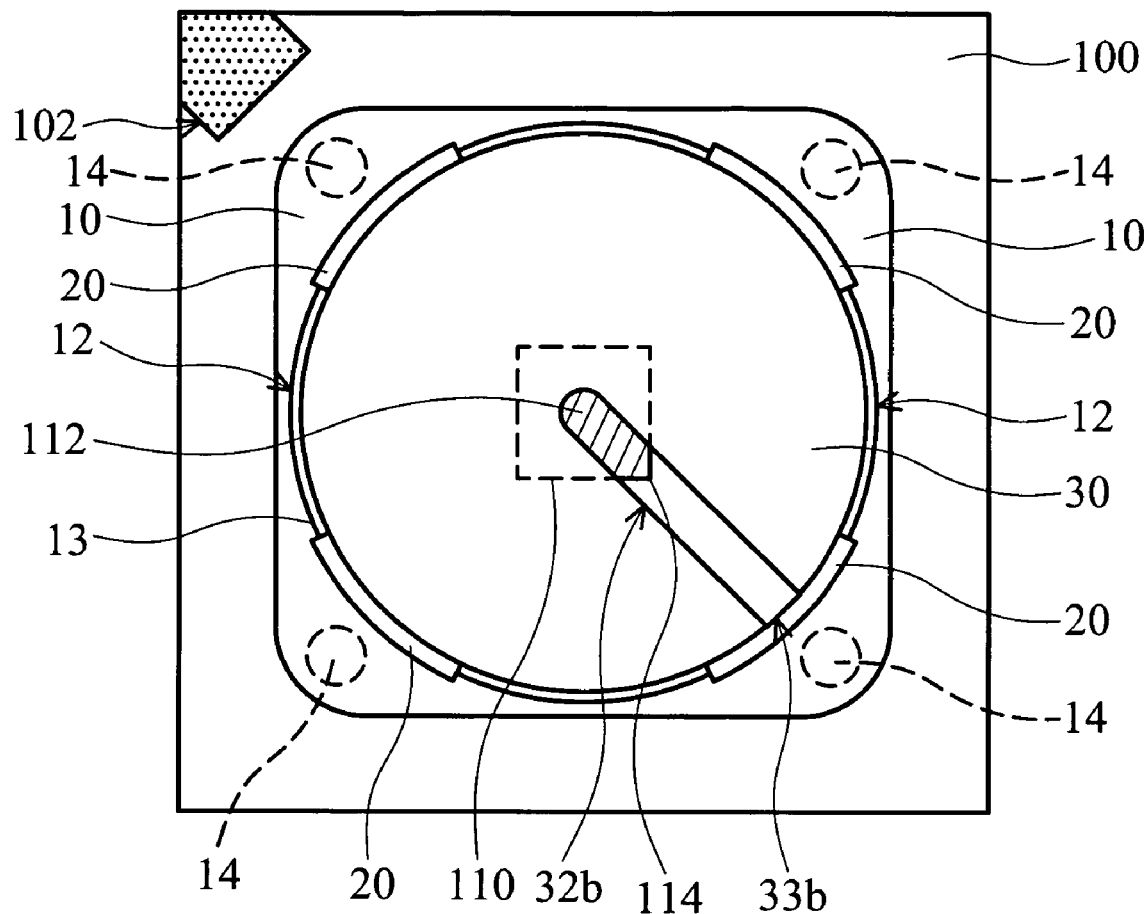
FIG. 2C is a top view of the relationship of a chip, substrate, and heat spreader shown in FIG. 2A when the heat spreader is disposed on the substrate with the chip thereon during a packaging process.

In FIG. 2C, the heat spreader is aligned and attached to a substrate 100, with a chip 110 disposed thereon and a molding gate 102 at a corner. The hole 32b is directly above and exposes a region between the center 112 and corner 114 of the chip 110, wherein the corner 114 is the farthest from the molding gate 102. Thus, the position and size of the hole 32b depend on the predetermined region of the chip 110. The hole 32b, as in with the hole 32a of the first embodiment, is directly above a region between the center 112 and corner 114 to assist in release of thermal stress induced by thermal cycles from the environment or performance in reliability tests such as TCT on a package structure utilizing the heat spreader of this embodiment.

Next, package structures of the third through fifth embodiments of the invention are described. The heat spreader of the second embodiment utilized in these structures is an example and not intended to limit the scope of the invention. Those skilled in the art will recognize the possibility of utilizing various heat spreaders of the first and second embodiments in these package structures.

Figure 3:
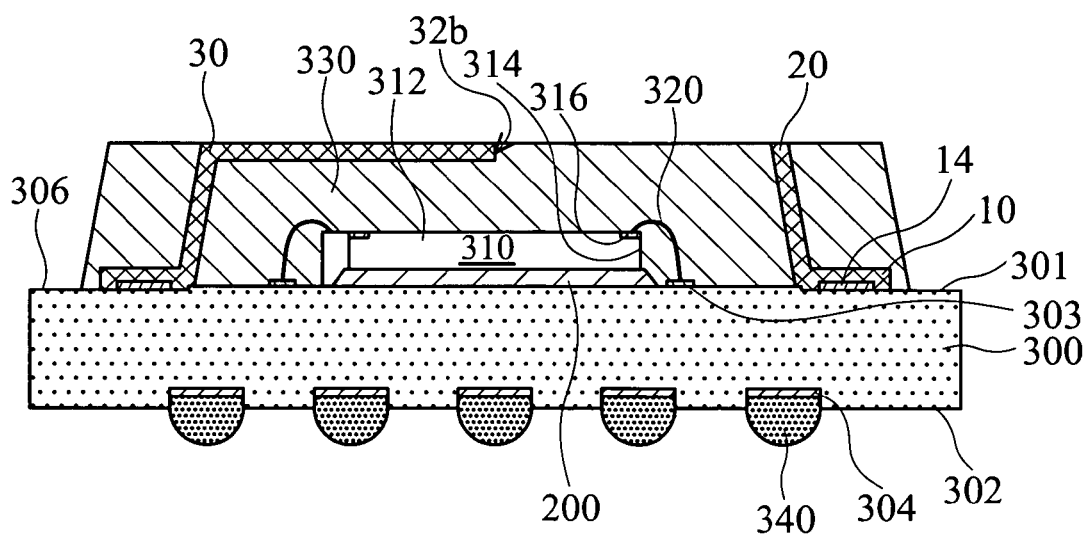
FIG. 3 is a cross-section of a package structure of a third embodiment of the invention, which utilizes the heat spreader shown in FIG. 1A.

In FIG. 3, a cross-section of a package structure of the third embodiment along a diagonal thereof is shown. First, a substrate 300 such as a plastic or ceramic printed circuit board for a BGA package, or a lead frame is provided. The substrate 300 comprises a first surface 301 and second surface 302 opposite to the first surface 301. The first surface 301 comprises a first electrode 303 thereon and molding gate 306 at a corner. The second surface 302 comprises a second electrode 304 thereon. The second electrode 304 can be a conductive pad for BGA or LGA package, or a conductive lead for surface mount technology (SMT) or pin-through-hole (PTH) technology. The first electrode 303 and second electrode 304 are preferably electrically connected by a wiring, preferably between the first surface 301 and second surface 302. A connecting material 200 such as an epoxy with or without silver particles is then applied to the first surface 301 beyond the first electrode 303 and molding gate 306, followed by attachment of a chip 310 and a curing step to harden the connecting material 200. Thus, the chip 310 is disposed on the first surface 301. The chip 310 has a center 312, corner 314, and an exposed third electrode 316 thereon. The corner 314 is the farthest from the molding gate 306. Next, a conductive material 320 such as a gold wire or an aluminum wire is formed by a conventional wire bonding step to electrically connect the first electrode 303 and second electrode 316. Next, the heat spreader of the second embodiment is disposed on the first surface 301 and beyond the molding gate 306 as that shown in FIG. 2C. Thus, details regarding the heat spreader and relationships among the heat spreader, substrate 300, and chip 310 are the same as those in the second embodiment, and thus, are omitted herefrom. Further, an encapsulant 330 is applied to the substrate 300 to fill the area beneath the cap plate 330 and overlying the base 10, followed by a curing step to harden the encapsulant 330. Thereafter, the cap plate 30 is exposed. The encapsulant 330 comprises epoxy resin, hardener, and inorganic filler. The filler content in the encapsulant 330 is preferably between 89 to 92 wt % to reduce the linear coefficient of the encapsulant 330, resulting in reduction in thermal stress exerted on the chip 310 when the package is suffering thermal cycles from environmental factors or reliability testing such as TCT. Finally, when substrate 300 is for a BGA package, a solder ball 340 is formed on the second electrode 304. When the electrode 304 is a conductive lead for surface mount technology (SMT) or PTH technology, it is trimmed and deformed to be a predetermined shape.

Figure 4:
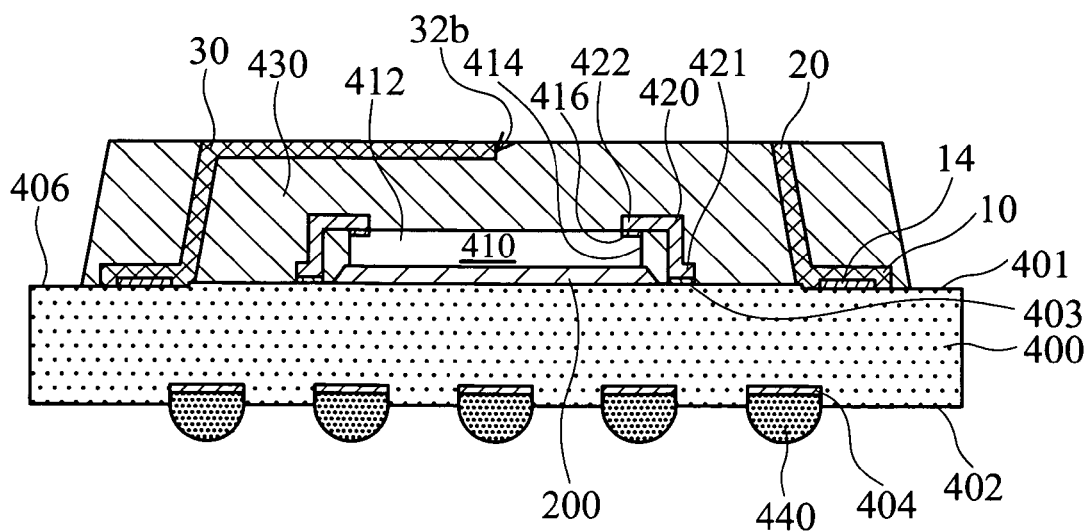
FIG. 4 is a cross-section of a package structure of a fourth embodiment of the invention, which utilizes the heat spreader shown in FIG. 1A.

FIG. 4 is a cross-section of a package structure of the fourth embodiment along a diagonal thereof. The package is a tape automatic bonding (TAB) package. First, a substrate 400 such as a flexible printed circuit board for TAB is provided. The substrate 400 comprises a first surface 401 and second surface 402 opposite to the first surface 401. The first surface 401 comprises a first electrode 403 thereon and molding gate 406 at a corner. A conductive lead 420, comprising two ends 421 and 422, is disposed on the first electrode 403 using the end 421. The second surface 402 comprises a second electrode 404 disposed thereon. The second electrode 404 can be a conductive pad for BGA or LGA package, or a conductive lead for SMT or PTH technology. The first electrode 403 and second electrode 404 are preferably electrically connected by a wiring preferably between the first surface 401 and second surface 402. The connecting material 200 is then applied to the first surface 401 beyond the first electrode 403 and molding gate 406, followed by attachment of a chip 410 and a curing step to harden the connecting material 200. Thus, the chip 410 is disposed on the first surface 401. The chip 410 comprises a center 412, corner 414, and an exposed third electrode 416 thereon. The corner 414 is the farthest from the molding gate 406. Next, the end 422 of the lead 420 is bonded to the third electrode 416. The heat spreader of the second embodiment is then disposed on the first surface 401 and beyond the molding gate 406 as that shown in FIG. 2C. Thus, details regarding the heat spreader and relationships among the heat spreader, substrate 400, and chip 410 are the same as those in the second embodiment, and thus, are omitted herefrom. Further, an encapsulant 430 is applied to the substrate 400 to fill the area beneath the cap plate 430 and overlying the base 10, followed by a curing step to harden the encapsulant 430. Finally, when substrate 400 is for a BGA package, a solder ball 440 is formed on the second electrode 304. Similarly, details regarding the encapsulant 430 and electrode 404 are the same as those in the third embodiment, and thus, are omitted herefrom.

Figure 5:
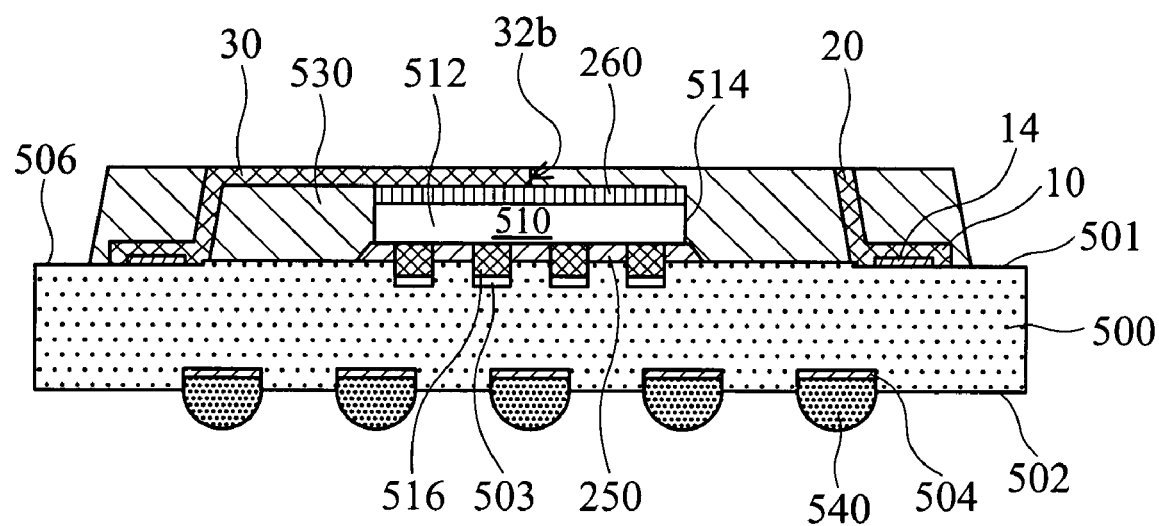
FIG. 5 is a cross-section of a package structure of a fifth embodiment of the invention, which utilizes the heat spreader shown in FIG. 1A.

FIG. 5 is a cross-section of a package structure of the fifth embodiment along a diagonal thereof. First, a substrate 500 such as a plastic or ceramic printed circuit board for a BGA package, or a lead frame is provided. The substrate 500 comprises a first surface 501 and second surface 502 opposite to the first surface 501. The first surface 501 comprises a first electrode 503 thereon and molding gate 506 at a corner. The second surface 502 comprises a second electrode 504 thereon. The first electrode 503 is for flip-chip bonding. The second electrode 504 can be a conductive pad for BGA or LGA package, or a conductive lead for SMT or PTH technology. The first electrode 503 and second electrode 504 are preferably electrically connected by a wiring preferably between the first surface 501 and second surface 502. Then, a chip 510, comprising a center 512, corner 514, and a third electrode 516, which is a conductive bump protruding from the chip 510, is provided, followed by alignment and attachment of the third electrode 516 to the first electrode 503. Thus, the third electrode 516 is electrically connected to the first electrode 503, and the chip 510 is disposed on the first surface 501. A thermal cycle such as reflow or thermal lamination is typically applied to strengthen the connection between the third electrode 516 and first electrode 503. Next, an underfill 250 is applied to fill the remaining space between the first surface 501 and chip 510. Next, the heat spreader of the second embodiment is disposed on the first surface 501 and beyond the molding gate 506 which is the same as that shown in FIG. 2C. Thus, details regarding the heat spreader and relationships among the heat spreader, substrate 500, and chip 510 are the same as those in the second embodiment, and such are omitted herefrom. The package is flip-chip bonding, hence it is preferable to thermally connect the chip 510 and cap plate 30 of the heat spreader by application of a thermally conductive material 260 therebetween. Further, an encapsulant 530 is applied to the substrate 500 to fill the area beneath the cap plate 530 and overlying the base 10, followed by a curing step to harden the encapsulant 530. Finally, when substrate 500 is for a BGA package, a solder ball 540 is formed on the second electrode 504. Similarly, details regarding the encapsulant 530 and electrode 504 are the same as those in the third embodiment, and thus, are omitted herefrom.

The holes 32b, respectively directly above regions between centers 312 through 512 and corners 314 through 514, respectively assist in releasing thermal stress induced by thermal cycles from the environment or performance in reliability tests such as a TCT on the package structures of examples 3 through 5. Thus, even when the chips 310 through 510 utilize the same low k material as the ILD layers thereof that have weaker adhesion between metal lines and the ILD layers thereof, the stress relief induced by the holes 35b prevents abnormal delamination of ILD layers at the edges 314 through 514 which are the farthest from the molding gates 306 through 506, respectively.

Thus, the results show the efficacy of the inventive heat spreader, and package structure utilizing the same in releasing and reducing thermal stress induced by environmental factors or package reliability tests on a specific position of a chip in a package, thus improving reliability of the package structure of the invention.

Further, when a chip utilizing a low k material as ILD layers thereof is packaged in a cavity-down package. Thermal stress induced by thermal cycles of the cavity-down package from the environmental factors or reliability tests such as a TCT may also delaminate the ILD layers. The delamination of the ILD layers utilizing the low k material can also be improved by application of an encapsulant having an organic filler of between 89 wt % to 92 wt % resulting from reduction mismatch of linear thermal expansion coefficients between the chip and encapsulant.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:
1. A package structure, comprising:
a substrate comprising a first surface, comprising a first electrode and molding gate thereon, and a second surface, comprising a second electrode thereon, opposite to the first surface;
a chip on the first surface and beyond the molding gate, the chip comprising a center, a corner which is the farthest from the molding gate, and a third electrode electrically connecting to the first electrode;
a heat spreader on the first surface and beyond the molding gate, the heat spreader comprising a base, with a penetrating opening surrounded by an inner edge, surrounding the chip, a plurality of support leads, with a predetermined width and protruding from the base, on the inner edge, and a cap plate fixed by the support leads to be above the chip, the cap plate comprising a hole at least exposing a region between the center and the corner of the chip; and an encapsulant filling the area beneath the cap plate and overlying the base, but exposing the cap plate.

2. The structure as claimed in claim 1, wherein the hole is a slot.

3. The structure as claimed in claim 1, wherein the encapsulant comprises 89 wt % to 92 wt % of inorganic fillers.

4. The structure as claimed in claim 1, further comprising a solder material on the second electrode.

5. The structure as claimed in claim 1, wherein the third electrode of the chip electrically connects to the first electrode using wire bonding, tape automatic bonding (TAB), or flip-chip bonding.

6. The structure as claimed in claim 5, wherein the chip thermally connects to the cap plate when the third electrode electrically connects to the first electrode using flip-chip bonding.

7. The structure as claimed in claim 1, wherein the cap plate further comprises an edge and the hole further extends to the edge, forming an extending end.

8. The structure as claimed in claim 7, wherein each of the support leads at least partially holds the cap pate.

9. The structure as claimed in claim 7, wherein one of the support leads at least partially holds the cap plate and extending end, and the remaining support leads completely contact the cap plate.

10. A package structure, comprising:
a substrate having a first surface having a first electrode and molding gate thereon, and a second surface, having a second electrode thereon, opposite to the first surface;
a chip on the first surface and beyond the molding gate, the chip having a center, a corner which is the farthest from the molding gate, and an exposed third electrode thereon;
a conductive material electrically connecting the third electrode of the chip and first electrode of the substrate;
a heat spreader on the first surface and beyond the molding gate, the heat spreader comprising a base, with a penetrating opening surrounded by an inner edge, surrounding the chip, a plurality of support leads, with a predetermined width and protruding from the base, ranged with a predetermined pitch on the inner edge, and a cap plate fixed by the support leads to be above the chip and conductive material, the cap plate having a through slot at least exposing a region between the center and the corner of the chip;
an encapsulant filling beneath the cap plate and overlying the base, but exposing the cap plate; and
a solder ball on the second electrode.

11. The structure as claimed in claim 10, wherein the cap plate further comprises an edge and the through slot ffirther extends to the edge, forming an extending end.

12. The structure as claimed in claim 11, wherein one of the support leads at least partially holds the cap plate and opening, and the remaining support leads completely contact the cap plate.

13. The structure as claimed in claim 11, wherein the encapsulant comprises 89 wt % to 92 wt % of inorganic fillers.

14. The structure as claimed in claim 11, wherein the substrate further comprises an inner wiring, electrically connecting the first electrode and second electrode, between the first surface and second surface.

15. The structure as claimed in claim 11, wherein the conductive material comprises a metal wire or TAB lead.

* * * * *